(12) United States Patent
Zumstrull

(10) Patent No.: US 7,646,139 B2
(45) Date of Patent: Jan. 12, 2010

(54) HEAD PLATE ASSEMBLY FOR AN ACTUATOR AND METHOD FOR PRODUCING AN ACTUATOR

(75) Inventor: Claus Zumstrull, Regenstauf (DE)

(73) Assignee: Siemens Aktiengesellschaft, Munich (DE)

( * ) Notice: Subject to any disclaimer, the term of this patent is extended or adjusted under 35 U.S.C. 154(b) by 187 days.

(21) Appl. No.: 11/569,101

(22) PCT Filed: May 2, 2005

(86) PCT No.: PCT/EP2005/052000

§ 371 (c)(1),
(2), (4) Date: Nov. 14, 2006

(87) PCT Pub. No.: WO2005/112142

PCT Pub. Date: Nov. 24, 2005

(65) Prior Publication Data

US 2008/0191065 A1    Aug. 14, 2008

(30) Foreign Application Priority Data

May 14, 2004  (DE) .................. 10 2004 024 123

(51) Int. Cl.
*H01L 41/083* (2006.01)
(52) U.S. Cl. .............. 310/348; 310/328; 310/344
(58) Field of Classification Search ......... 310/328, 310/344, 348
See application file for complete search history.

(56) References Cited

U.S. PATENT DOCUMENTS

| | | | | |
|---|---|---|---|---|
| 4,803,393 A | * | 2/1989 | Takahashi | 310/328 |
| 4,803,763 A | * | 2/1989 | Eturo et al. | 29/25.35 |
| 5,059,857 A | | 10/1991 | Brandt et al. | 310/366 |
| 5,250,868 A | | 10/1993 | Shirasu | 310/328 |
| 5,477,102 A | * | 12/1995 | Miyoshi | 310/344 |
| 5,939,817 A | * | 8/1999 | Takado | 310/348 |
| 6,274,967 B1 | * | 8/2001 | Zumstrull et al. | 310/328 |
| 6,316,863 B1 | | 11/2001 | Schuh et al. | 310/328 |
| 2002/0084723 A1 | * | 7/2002 | Kawazoe | 310/348 |
| 2003/0107301 A1 | * | 6/2003 | Asano et al. | 310/328 |
| 2007/0080610 A1 | * | 4/2007 | Sato et al. | 310/348 |
| 2008/0315726 A1 | * | 12/2008 | Dollgast et al. | 310/348 |

FOREIGN PATENT DOCUMENTS

| | | |
|---|---|---|
| DE | 19715488 C1 | 6/1998 |
| DE | 19715487 A1 | 10/1998 |
| DE | 19818068 A1 | 10/1999 |

(Continued)

OTHER PUBLICATIONS

International Search Report and Written Opinion for International Application No. PCT/EP2005/052000 (10 pages), Jul. 26, 2005.

(Continued)

*Primary Examiner*—Thomas M Dougherty
(74) *Attorney, Agent, or Firm*—King & Spalding L.L.P.

(57) ABSTRACT

A head plate assembly (1) for an actuator, has a cover (2), a lead-through (3), at least one connecting pin (4) led through the lead-through (3), and a seal (5) obturating the lead-through of the connecting pin. The head plate assembly (1) is pre-assembled without the actuator.

19 Claims, 1 Drawing Sheet

FOREIGN PATENT DOCUMENTS

| | | |
|---|---|---|
| DE | 10026635 A1 | 1/2002 |
| DE | 10048430 A1 | 4/2002 |
| DE | 10229494 A1 | 1/2004 |
| DE | 10259320 A1 | 2/2004 |
| DE | 10347774 A1 * | 5/2005 |
| EP | 0319038 A2 | 6/1989 |
| EP | 0954037 A1 | 11/1999 |
| WO | 2004/047191 A2 | 6/2004 |

OTHER PUBLICATIONS

German Office Action for German Patent Application No. 10 2004 024 123.6 (5 pages), Jan. 31, 2005.

* cited by examiner

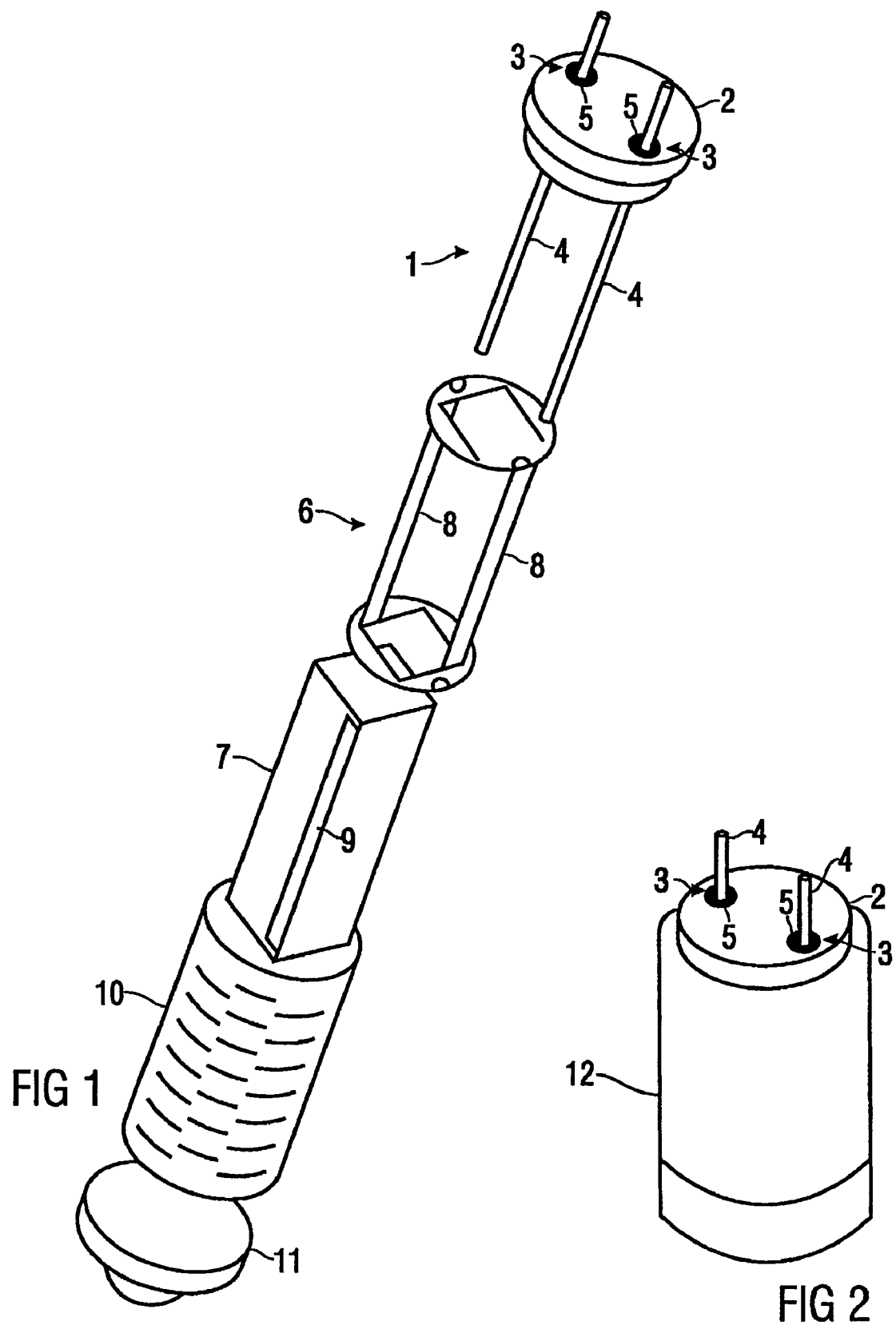

HEAD PLATE ASSEMBLY FOR AN ACTUATOR AND METHOD FOR PRODUCING AN ACTUATOR

CROSS-REFERENCE TO RELATED APPLICATIONS

This application is a U.S. national stage application of International Application No. PCT/EP2005/052000 filed May 2, 2005, which designates the United States of America, and claims priority to German application number DE 10 2004 024 123.6 filed May 14, 2004, the contents of which are hereby incorporated by reference in their entirety.

TECHNICAL FIELD

The invention relates to a head plate assembly for an actuator according to the preamble of claim 1 and to a manufacturing method for an actuator according to the preamble of claim 15.

BACKGROUND

In modern-day injection systems for internal combustion engines, piezoelectric actuators are employed as actuating elements for injection valves. In order to protect the piezo actuators against damaging environmental influences the actuators are provided with sealed housings. In this case the electric supply lines of the actuator must be fed through the housing enclosing the actuator.

DE 197 15 487 A1 discloses a piezo actuator which consists of a prefabricated hollow profile into which the piezo elements and two contact pins which serve for electrically contacting the piezo elements are introduced. A cover is mounted onto the hollow profile containing the inserted piezo elements and the inserted contact pins and is subsequently injection-molded with plastic.

A disadvantage with the described structure is for example that it is necessary to avoid the injection molding compound penetrating into the interior of the actuator. Moreover, injection molding with plastic is complicated, costly and time-consuming. In addition, the sealing action of the plastic at the feed-throughs for the connecting contacts is also unsatisfactory, with the result that the interior of the actuator is inadequately protected against penetrating engine oil or penetrating water.

SUMMARY

The object underlying the invention is therefore to specify a device for an actuator which seals off the interior of the actuator as reliably as possible with the minimum amount of overhead. It is also an object of the invention to specify a manufacturing method by means of which a device of said kind can be produced with the minimum amount of overhead in terms of time and expenditure.

A head plate assembly for an actuator may comprise a cover for covering the actuator, at least one feed-through disposed in the cover, at least one connecting pin guided through the feed-through for electrically contacting the actuator, wherein the connecting pin is sufficiently long to extend over at least a large part of the length of an actuator body, and
 a seal closing the feed-through, wherein
  the seal is a glass seal, and the head plate assembly is preassembled without the actuator.

An actuator may have such a head plate assembly. An injector for an internal combustion engine may have such an actuator. A manufacturing method for an actuator having an actuator body and a head plate assembly, the head plate assembly having a cover, at least one feed-through, at least one connecting pin guided through the feed-through and at least one seal closing the feed-through, the connecting pin being sufficiently long to extend over at least a large part of the length of the actuator body, may comprise the following steps in this order:—preassembly of the head plate assembly and—assembly of the head plate assembly with the actuator body, wherein the seal being a glass seal.

BRIEF DESCRIPTION OF THE DRAWINGS

The inventive head plate assembly and the inventive actuator which can be produced by means of an inventive manufacturing method are explained in more detail below with reference to the accompanying drawings, in which:

FIG. 1 shows schematically in an exploded view the construction of an inventive head plate assembly and a piezo actuator containing the head plate assembly.

FIG. 2 shows a sealed piezo actuator.

DETAILED DESCRIPTION

The invention proceeds on the basis of the technical knowledge that more reliable seals can be installed in the head plate assembly if the head plate assembly is preassembled without the actuator. In this case seals can be used whose installation into a cover of the actuator requires for example specific temperature profiles. By preassembly of the head plate assembly it is possible to work with temperature profiles which in the case of a traditional assembly, which is to say with sealing of the already assembled actuator, could destroy parts of the actuator.

In an embodiment, the head plate assembly is advantageously constructed from a cover and a connecting pin fed through same, the connecting pin being sufficiently long to extend over at least a large part of the length of an actuator body. This has the advantage that for the purpose of electrically contacting individual piezo elements of the actuator body, for example, only a short electrical lead is required between the piezo element and the connecting pin. Advantageously, in an embodiment, the connecting pin is therefore sufficiently long to extend over the entire length of the actuator body.

In an embodiment, the feed-through of the connecting pin through the cover is preferably sealed by means of a seal. In this way the interior of the actuator can be protected against damaging environmental influences. In an embodiment, ceramic or plastic seals, for example, are suitable for the seal, although other materials which are suitable for sealing off the feed-through are also available. In an embodiment, it can be advantageous that in the choice of seal no consideration must be given to the actuator body possibly being damaged during the mounting of the seal, since the seal is mounted before the head plate assembly is connected to the actuator body.

In an embodiment, the seal is preferably a glass seal. A glass seal offers the advantage of a very good seal, the glass seal preferably having a limit leak rate of $10^{-8}$ mbar/s. A small limit leak rate is advantageous, since it prevents fluids or gases from penetrating into the actuator chamber. Thus, glass seals with a limit leak rate of $10^{-11}$ mbar/s or less may also be suitable. If the connecting pin is completely enclosed by the glass seal, this offers the advantage that the glass seal simultaneously insulates the connecting pin electrically from the cover, which is of advantage in particular when the cover is made of metal. However, it can also be advantageous on account of the construction of the glass seal or the cover that the glass seal only partially encloses the fed-through connecting pin.

In an embodiment, the glass seal can be implemented as a customized glass-to-metal feed-through or as a prestressed glass feed-through. With customized glass-to-metal feed-throughs, glass types and metal parts are used whose coefficients of expansion largely correspond between room temperature and the transformation temperature of the glass. In this way it is ensured that the fed-through connecting pin is sealed into the glass without mechanical stresses arising in the fusion during cooling. Customized glass-to-metal feed-throughs also offer the advantage, for example, that a plurality of connecting pins can be sealed into a feed-through without great effort, said connecting pins being electrically insulated from one another by the glass. In this case the invention offers particular advantages, since in the temperature profile for the installation of the customized glass-to-metal feed-through, i.e. during the sealing-in of the glass, no consideration needs to be given to a temperature sensitivity of components of the actuator body. First, the head plate assembly is preassembled with the cover, the glass seal and the fed-through connecting pin, and subsequently the actuator body is assembled with the head plate assembly. In contrast to customized glass-to-metal feed-throughs, with prestressed glass feed-throughs use is made of metals and glass types whose coefficients of thermal expansion are different. Preferably the coefficient of thermal expansion of the external cover is higher than that of the sealing glass and that of the metallic connecting pin. This offers the advantage that after the glass seal and the metallic connecting pin have been inserted and the subsequent cooling, the external cover compresses the glass as a result of its considerably higher contraction. This offers the advantage that the seal is under pressure and so has a very low leak rate. The cover can, for example, consist of a metal which has a coefficient of thermal expansion $\alpha$ of $13 \times 10^{-6}$ 1/K between 20 and 300° C. It is also possible to use coefficients of expansion between $9 \times 10^{-6}$ 1/K and $18 \times 10^{-6}$ 1/K. The coefficients of expansion of the glass and the connecting pin in the same temperature range should be less than this, ranging, for example, between $5 \times 10^{-6}$ 1/K and $9 \times 10^{-6}$ 1/K. Even with pre stressed glass feed-throughs, the inventive preassembly of the head plate assembly offers the advantage of an independent temperature profile during the installation of the glass seal.

Advantageously, in an embodiment, the connecting pin has at least one flat side. On the one hand this offers the advantage that flat connectors can also be mounted for the purpose of external contacting, flat connectors being able to provide a better support than round connectors. On the other hand this offers the advantage that contacting means of piezo elements of the actuator body with short connecting wires can be more easily connected to the connecting pin, since wires are easier to weld onto level surfaces than onto round surfaces. In this case the connecting pin can have a cross-section in which a piece is cut out from a circle. It can, however, also have any other shapes, such as, for example, a rectangular shape. It can also be advantageous to provide the connecting pin at the level of the actuator body with a different cross-section than at the level of the feed-through or the external contacting means. This can be advantageous, for example, if a particular shape of cross-section is advantageous for the contacting of the actuator body and another for the attachment of a connector contact.

In an embodiment, preferably the cover consists at least partially of metal or ceramic. Metal or ceramic offers the advantage of a high strength and a high degree of resistance against attacks by harmful environmental influences.

In an embodiment, if a retainer for spatial fixing of an actuator body is preassembled together with the head plate assembly, this offers the advantage that the actuator body is held at a defined position by the retainer, for example if the actuator is subsequently sealed in the further manufacturing method. A retainer preassembled with the head plate assembly also offers the advantage that for the purpose of assembly the actuator body merely has to be pushed into the retainer. For fixing purposes a clip, for example, can be provided which secures the actuator body against a sliding out from the retainer during the further assembly process. In the fully assembled actuator the actuator body is typically fixed in its longitudinal direction, which is to say in its direction of action. The retainer holds it in the transverse direction.

In an embodiment, preferably the retainer according to the invention has an integrated edge protection in order to protect an axially running, i.e. running in the longitudinal direction, edge of the piezo stack. Said edge protection can have, for example, at least one axially running bridge which covers the edge of the piezo stack requiring protection. Typically, the individual elements of piezo stacks are contacted by implementing a wire wrapping which connects the connecting pins to the piezo elements. As two opposite edges are usually subject to mechanical stresses during the wrapping of the piezo stack with wire, the edge protection preferably covers axially running opposite edges of the piezo stack. An edge protection of this kind can be implemented for example in that the retainer of the assembly receptacle according to the invention is embodied in the shape of a cage and has two front plates which are connected to each other by bridges, the bridges between the two front plates additionally serving as edge protection for the piezo stack.

In an embodiment, if a gap is left between the edge protection and the piezo stack, said gap being sufficiently large to allow the sealing compound to penetrate during the casting of the piezo actuator in an assembly receptacle, this offers the advantage that the piezo stack is reliably cast.

In an embodiment, during the wrapping of the piezo unit, which comprises the piezo stack and the retainer, with an electrically conductive wire, the piezo unit together with the head plate assembly including the connecting pins is usually rotated relative to the wire feed. During the wrapping process this leads to a wire tension which, at a constant rotational speed of the piezo unit, is dependent on the effective wrapping radius of the piezo unit. In order to facilitate the wire wrapping, the axially running edges of the piezo stack together with the connecting pins and the edge protection therefore preferably form, in cross-section, a polygon with at least six corners. Such an embodiment of the retainer offers the advantage that the wire tension during the wrapping process exhibits only slight fluctuations. It should be mentioned in this context that in practice the polygon formed by the edges of the piezo stack, the connecting pins and the edge protection has no precise corners and edges, so this term should be understood as illustrative. Thus, for example, the bridges between the front plates of the cage-shaped retainer can in practice be sharply rounded, which does not, however, preclude the wire-wrapping as envisioned according to the invention. In order to obtain as uniform a radius as possible during the wrapping it is advantageous if the polygon formed by the edges of the piezo stack, the connecting pins and the edge protection is essentially equilateral.

An actuator having a head plate assembly in one of the above-described inventive embodiments is also a subject matter of the invention. An actuator of this kind offers the advantage that it is reliably protected against the penetration of contaminants, since the preassembled head plate assembly permits a reliable sealing of the feed-throughs of the connecting pins.

In an embodiment, advantageously, the actuator has a Bourdon spring and a bottom plate connected to the Bourdon spring in order to apply a pretension to the actuator body. If the actuator body consists of piezo elements, this offers the advantage that destruction of the piezo elements is avoided. The Bourdon spring is preferably connected to the head plate assembly; it can, for example, be welded to the cover. The actuator body is advantageously clamped between the bottom plate and the cover, while in the transverse direction it is supported by the retainer against giving way laterally.

In an embodiment, preferably the actuator is sealed with a sealing compound in order to give the actuator body and the contacting elements support so that, for example, a destruction of the actuator contacting elements due to shocks during operation is avoided. Sealing with a sealing compound also offers the advantage that the actuator contacting elements are electrically insulated and no undesirable contacts occur during operation. Silicon, for example, is suitable as a sealing compound, although other materials which have insulating properties and are easy to cast can also be used.

In an embodiment, advantageously the actuator is installed into a metal housing and a sealing diaphragm, thereby sealing the actuator to the outside. If the metal housing is welded to the head plate assembly and the bottom plate, it is possible to manufacture a completely sealed actuator which is reliably protected against environmental influences.

An injector for an internal combustion engine having an actuator according to the invention and an injection system for an internal combustion engine having such an injector are also the subject matter of the invention.

FIG. 1 shows a preassembled head plate assembly 1 which is manufactured on the basis of a cover 2 made of metal in which there are disposed two feed-throughs 3 through which two connecting pins 4 are guided. The feed-throughs 3 are sealed by mounting fitted glass-to-metal feed-throughs as glass seals 5 between the cover 2 and the connecting pins 4.

In the next step, an actuator cage 6 is also mounted on the head plate assembly 1, said actuator cage 6 being welded to the cover 2. The actuator cage 6 acts as a retainer for a piezo stack 7 which consists of a stack of many individual piezo elements. The actuator cage 6 has two bridges 8 which protect the piezo stack 7 when it is being wrapped with a connecting wire. Feed-throughs for guiding through the connecting pins 4 are also mounted in the actuator cage 6.

When the piezo stack 7 is mounted in the actuator cage 6, the piezo stack 7 is contacted by being wrapped in wire (not shown). In this arrangement the individual turns of the wire wrapping each have a spacing which corresponds to the height of a piezo element. The wire is welded in each case to one of the two connecting pins 4 and to an external piezo contacting element 9 (only the front one is shown in FIG. 1). The superfluous pieces of wire are separated out.

Next, a Bourdon spring 10 is inserted over the actuator cage 6 and welded to the head plate assembly 1. A bottom plate 11 is welded onto the side of the Bourdon spring 10 facing away from the head plate assembly 1, with the result that the Bourdon spring 10 applies a pretension to the piezo stack 7.

In order to prevent short circuits to ground, improve heat dissipation and provide better absorption of vibrations, the piezo actuator is sealed in this state by spraying with, for example, silicon. A metal housing 12 and a sealing diaphragm are then welded to the piezo actuator in order to produce a completely sealed piezo actuator, as shown in FIG. 2. Apart from that, in FIG. 2 the same reference numerals designate the same parts as in FIG. 1.

The invention is not restricted to the above-described exemplary embodiment. Rather, a multiplicity of variants and modifications which also make use of the inventive idea and therefore also fall within the scope of protection are possible.

What is claimed is:

1. A head plate assembly for an actuator, comprising
a cover for covering the actuator,
at least one feed-through disposed in the cover,
at least one connecting pin guided through the feed-through for electrically contacting the actuator,
wherein the connecting pin is sufficiently long to extend over at least a large part of the length of an actuator body, and
a seal closing the feed-through, wherein
the seal is a glass seal, and
the head plate assembly is preassembled without the actuator, further comprising a retainer for spatial fixing of an actuator body, wherein the retainer comprises an actuator cage, and an edge protector for protecting an axially running edge of the actuator body, the edge protection having an axially running bridge.

2. The head plate assembly as claimed in claim 1, wherein the glass seal is a sealed-in glass seal.

3. The head plate assembly as claimed in claim 1, wherein the connecting pin has at least one flat side.

4. The head plate assembly as claimed in claim 1, wherein the cover consists at least partially of metal or ceramic.

5. The head plate assembly as claimed in claim 1, comprising a retainer for spatial fixing of an actuator body, the retainer being preassembled in the head plate assembly without the actuator body.

6. The head plate assembly as claimed in claim 1, further comprising a retainer for spatial fixing of an actuator body, the retainer comprising two connecting pins, top and bottom actuator cages, and two edge protectors that comprise axially running bridges extending between the top and bottom actuator cages, wherein the edge protectors are positioned to cover two axially running opposite edges of the actuator body, wherein the two edge protectors, the two connecting pins and two other axially running edges of the actuator body together form a polygon with at least six corners in order to facilitate wire-wrapping.

7. An actuator having a head plate assembly comprising
a cover for covering the actuator,
at least one feed-through disposed in the cover,
at least one connecting pin guided through the feed-through for electrically contacting the actuator,
wherein the connecting pin is sufficiently long to extend over at least a large part of the length of an actuator body, and
a retainer mounted to the cover for spatial fixing of an actuator body, the retainer comprising top and bottom actuator cages and two edge protectors that comprise axially running bridges extending between the top and bottom actuator cages, wherein the tip actuator cage has a feed-through and the at least one connecting pin guided through the feed-through for electrically contacting the actuator,
a seal closing the feed-through, wherein
the seal is a glass seal, and
the head plate assembly is preassembled without the actuator.

8. The actuator as claimed in claim 7, wherein a Bourdon spring and a bottom plate connected to the Bourdon spring for applying a pretension to the actuator body, the Bourdon spring being connected to the head plate assembly.

9. The actuator as claimed in claim 7, wherein the actuator is sealed by means of a sealing compound.

10. The actuator as claimed in claim 7, comprising a metal housing and a sealing diaphragm to ensure that the actuator is sealed to the outside.

11. An injector for an internal combustion engine having an actuator comprising a head plate assembly comprising
a cover for covering the actuator,
at least one feed-through disposed in the cover,
at least one connecting pin guided through the feed-through for electrically contacting the actuator,
wherein the connecting pin is sufficiently long to extend over at least a large part of the length of an actuator body, and
a retainer mounted to the cover for spatial fixing of an actuator body, the retainer comprising top and bottom actuator cages and two edge protectors that comprise axially running bridges extending between the top and bottom actuator cages, wherein the tip actuator cage has a feed-through and the at least one connecting pin guided through the feed- through for electrically contacting the actuator,
a seal closing the feed-through, wherein
the seal is a glass seal, and
the head plate assembly is preassembled without the actuator.

12. An injection system for an internal combustion engine having an injector as claimed in claim 11.

13. A head plate assembly for an actuator, comprising
a cover for covering the actuator,
at least two feed-through disposed in the cover,
at least two connecting pins guided through the feed-throughs for electrically contacting the actuator,
wherein the connecting pins are sufficiently long to extend over at least a large part of the length of an actuator body, and
seals closing the feed-throughs, wherein
the seals are glass seals,
a retainer for spatial fixing the actuator body, the retainer comprising top and bottom actuator cages and two edge protectors that comprise axially running bridges extending between the top and bottom actuator cages, wherein the two edge protectors are positioned to cover two axially running opposite edges of the actuator body, wherein the top actuator cage is mounted to the cover and has at least two feed-throughs such that the at least two connecting pins are guided through the feed-throughs in the top actuator cage for electrically contacting the actuator, wherein the two edge protectors, the two connecting pins and two other axially running edges of the actuator body together form a polygon with at least six corners in order to facilitate wire-wrapping,
the head plate assembly is preassembled without the actuator.

14. The head plate assembly as claimed in claim 13, wherein the glass seal is a sealed-in glass seal.

15. The head plate assembly as claimed in claim 13, wherein the at least two connecting pins have at least one flat side.

16. The head plate assembly as claimed in claim 13, wherein the cover comprises at least partially a metal or a ceramic.

17. The actuator as claimed in claim 13, further comprising a Bourdon spring and a bottom plate connected to the Bourdon spring for applying a pretension to the actuator body, the Bourdon spring being connected to the head plate assembly.

18. The actuator as claimed in claim 13, wherein the actuator is sealed by means of a sealing compound.

19. The actuator as claimed in claim 13, comprising a metal housing and a sealing diaphragm to ensure that the actuator is sealed to the outside.

* * * * *